(12) United States Patent
Akaogi

(10) Patent No.: US 6,646,950 B2
(45) Date of Patent: Nov. 11, 2003

(54) HIGH SPEED DECODER FOR FLASH MEMORY

(75) Inventor: Takao Akaogi, Cupertino, CA (US)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/846,099

(22) Filed: Apr. 30, 2001

(65) Prior Publication Data
US 2002/0159296 A1 Oct. 31, 2002

(51) Int. Cl.[7] .................................................. G11C 8/00
(52) U.S. Cl. ............................ 365/230.06; 365/189.09; 365/226; 365/233.5; 365/241; 365/185.13
(58) Field of Search ........................... 365/189.09, 226, 365/230.06, 233.5, 241, 185.13

(56) References Cited

U.S. PATENT DOCUMENTS 5,467,032 A   11/1995   Lee
6,026,047 A * 2/2000   Ryu et al. .............. 365/230.06
6,198,685 B1 * 3/2001   Sudo et al. ............ 365/230.06
6,229,755 B1 * 5/2001   Oh ........................ 365/230.06
6,255,900 B1 * 7/2001   Chang et al. ................ 327/589
6,347,052 B1 * 2/2002   Akaogi et al. ......... 365/185.23

FOREIGN PATENT DOCUMENTS

JP        05-120881       5/1993
JP        07-045074       2/1995

* cited by examiner

Primary Examiner—Van Thu Nguyen
(74) Attorney, Agent, or Firm—Sheppard Mullin Richter & Hampton LLP

(57) ABSTRACT

A word line driver for flash memories using NMOS circuitry to reduce parasitic capacitance loading on boost circuitry in low-voltage applications. A delay scheme which delays turn-on of the driver's source-drain circuit for a short time after the turn-on of the driver transistors' gates allows the gate capacitance of the driver transistor to provide an extra boost.

5 Claims, 4 Drawing Sheets

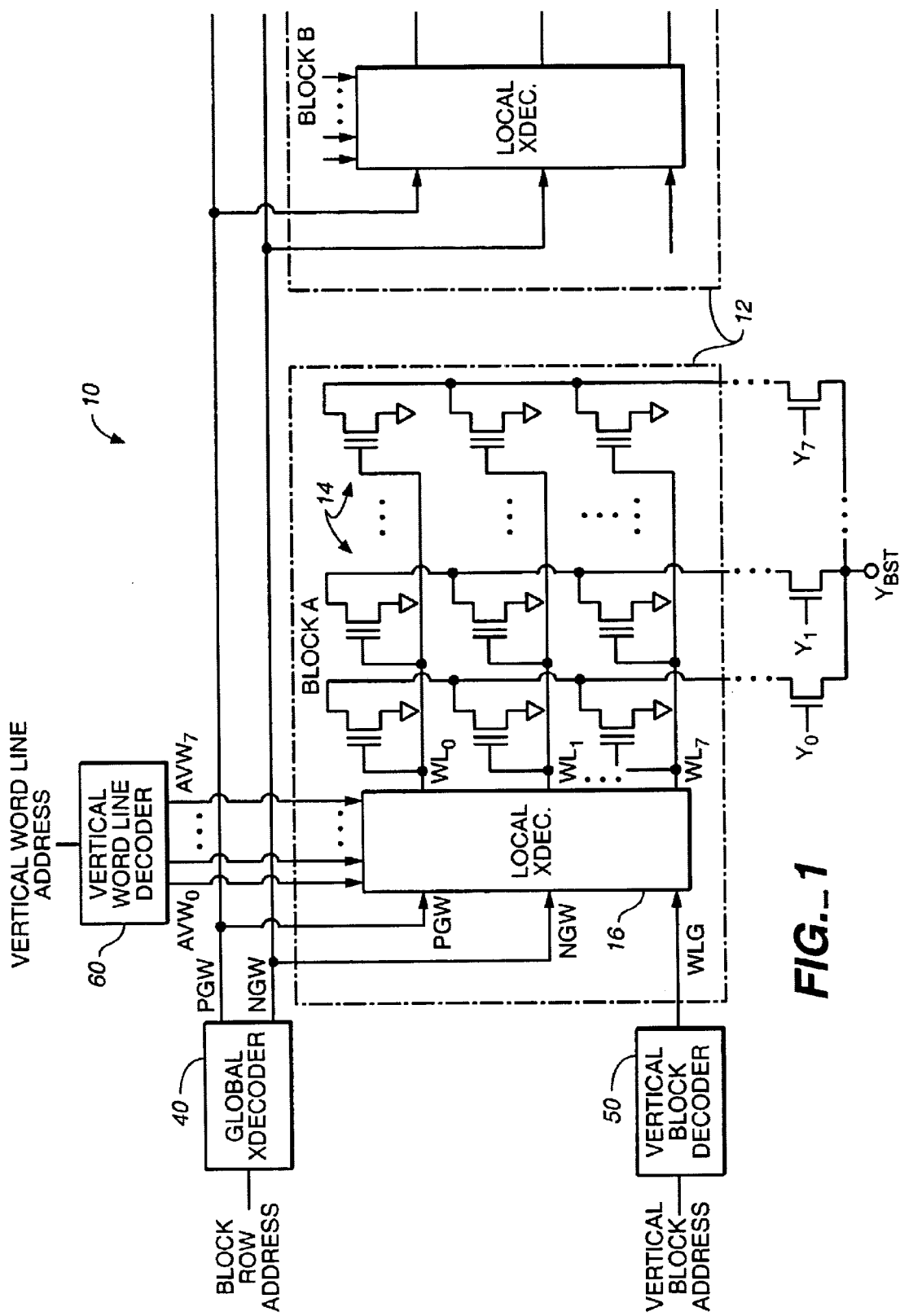
FIG._1

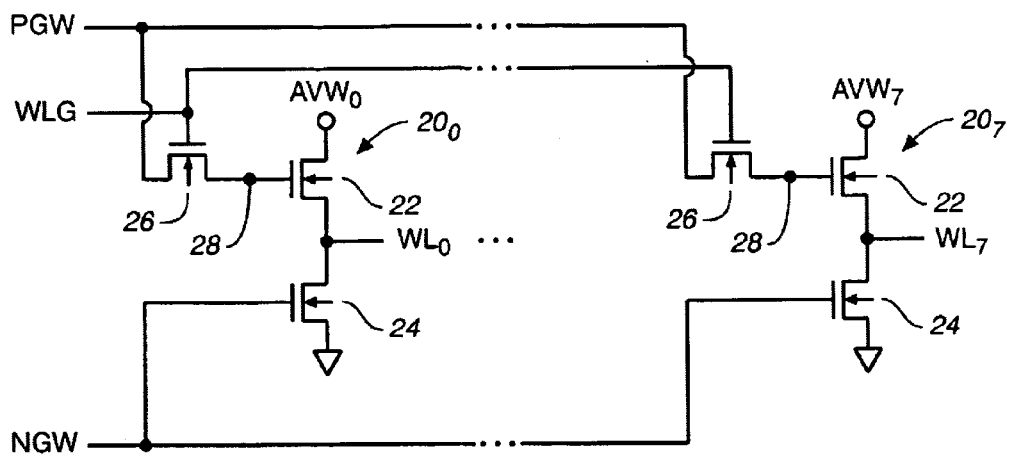
FIG._2
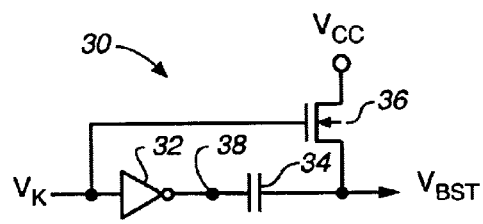
FIG._3
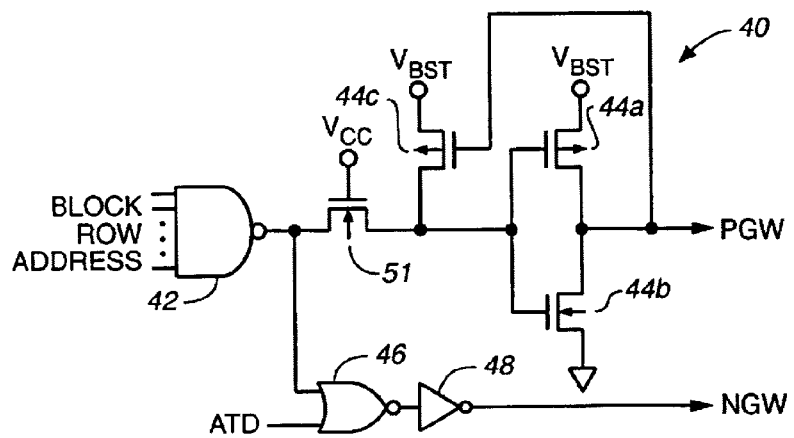
FIG._4

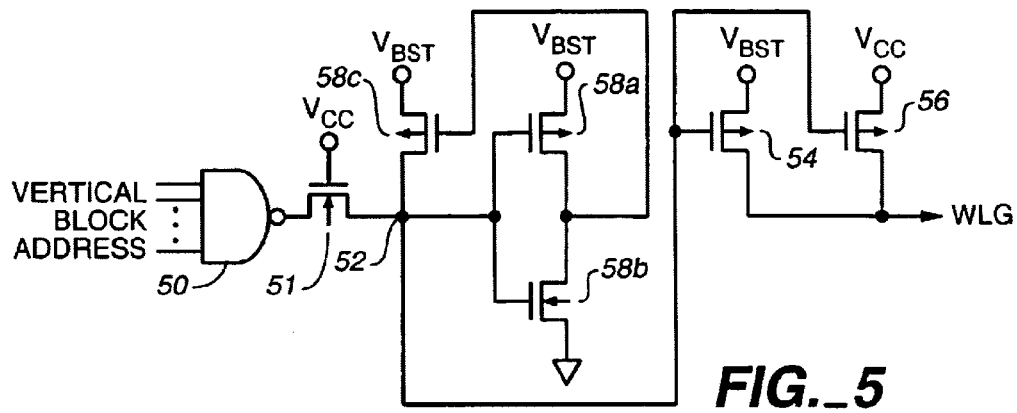
FIG._5
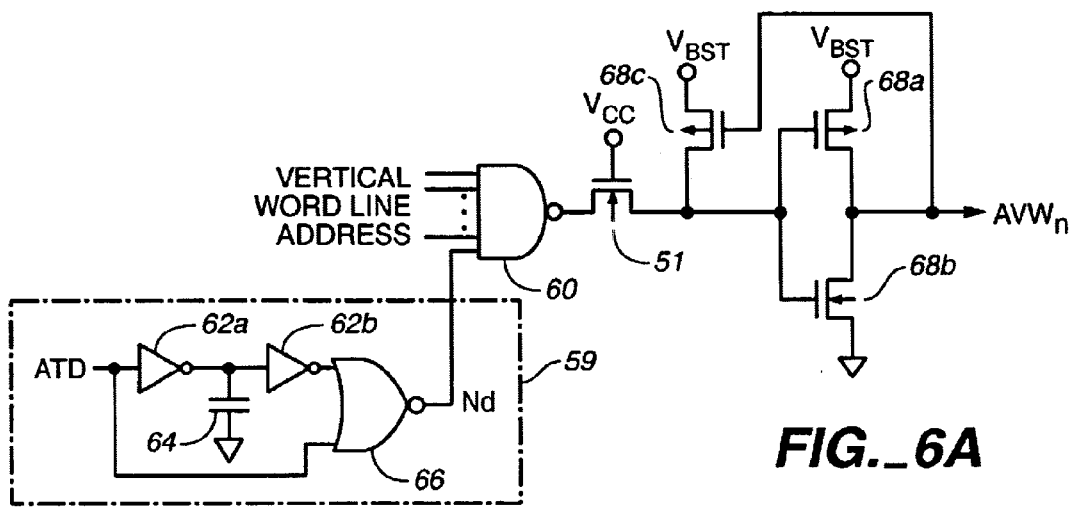
FIG._6A
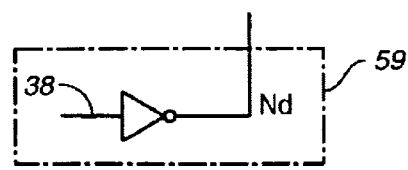
FIG._6B

HIGH SPEED DECODER FOR FLASH MEMORY

FIELD OF THE INVENTION

This invention relates to decoders for flash memories, and more particularly to a fast xdecoder using NMOS driver circuitry in combination with a time delay scheme to insure efficient boost operation.

BACKGROUND OF THE INVENTION

Flash memories conventionally consist of an array of floating gate transistors or core cells that are arranged in blocks and are individually addressable by energizing a specific word line and a specific bit line of the array. A "0" on a core cell corresponds to a high turn-on threshold voltage on the order of 4V for the cell, while a "1" corresponds to a low turn-on threshold voltage on the order of 2V. The word line for each cell is connected to its transistor's control gate, and the bit line for its address powers its source-drain circuit. A cell is read by driving its word line to a voltage between the above-mentioned threshold voltages while its source-drain circuit is energized. If current flows, the cell contains a "1"; if not, it contains a "0."

Traditionally, word line driver circuits for flash memories have been executed in CMOS topologies. These topologies have worked well with conventional robust $V_{CC}$ sources of 5V or more, where parasitic cell capacitances were not a significant consideration. In recent times, however, increasing miniaturization of electronics in general, and flash memories in particular, have led to smaller $V_{CC}$ supplies, on the order of 3V.

Because of this lower $V_{CC}$, it is necessary to use a voltage boosting circuit to provide a boost voltage $V_{BST}$ to the control gate. Such a circuit is quite sensitive to parasitic capacitance loading. It is in the nature of a CMOS driver for an xdecoder that its global word line must be low in order for the cell to be selected. Consequently, the word lines of all unselected cells must be high, a condition which loads the boost circuit and slows it down. Thus, for fast operation, it is desirable to provide a way of increasing boosting without loading the boost circuit.

SUMMARY OF THE INVENTION

The present invention solves the above-described problems by providing word line drivers using NMOS transistors, in combination with a time-delay addressing scheme that uses the driver transistors' gate capacitance to provide an extra boost.

BRIEF DESCRIPTION OF THE DRAWINGS

FIG. 1 is a circuit diagram showing a section of a flash memory using the invention;

FIG. 2 is a circuit diagram showing the word line driver of this invention;

FIG. 3 is a circuit diagram of a boost circuit useful in the invention;

FIG. 4 is a circuit diagram of a global xdecoder in the invention;

FIG. 5 is a circuit diagram of the word line gate driver;

FIGS. 6a and 6b are circuit diagrams of a Vxdecoder used in the invention; and

FIG. 1 illustrates a typical flash memory 10. The memory 10 is conventionally arranged in blocks 12 containing, for example, an array of 8×8 core cells or floating gate transistors 14. Each block 12 includes a local xdecoder 16 whose inputs are a positive global word line PGW, a negative global word line NGW, and (in FIG. 1) eight vertical word lines $AVW_0$ through $AVW_7$. The outputs of the local xdecoder 16 are the word lines $WL_0$ through $WL_7$, each of which serves as the word line for one horizontal row of core cells 14 in the block 12. Individual core cells 14 of a given horizontal row are addressed by turning on a selected one of bit line transistors $Y_0$ through $Y_7$.

FIG. 2 shows the details of the local xdecoder 16 according to the invention. For the 8×8 block of FIG. 1, there are eight drivers $20_0$ through $20_7$ that produce the word line signals $WL_0$ through $WL_7$. Each of the drivers consists of a series-connected pair of n-transistors 22, 24 and a word line gate n-transistor 26. The control gate of transistor 26 is connected to a word line gate signal WLG whose generation is described below in connection with FIG. 5.

Figure 7:
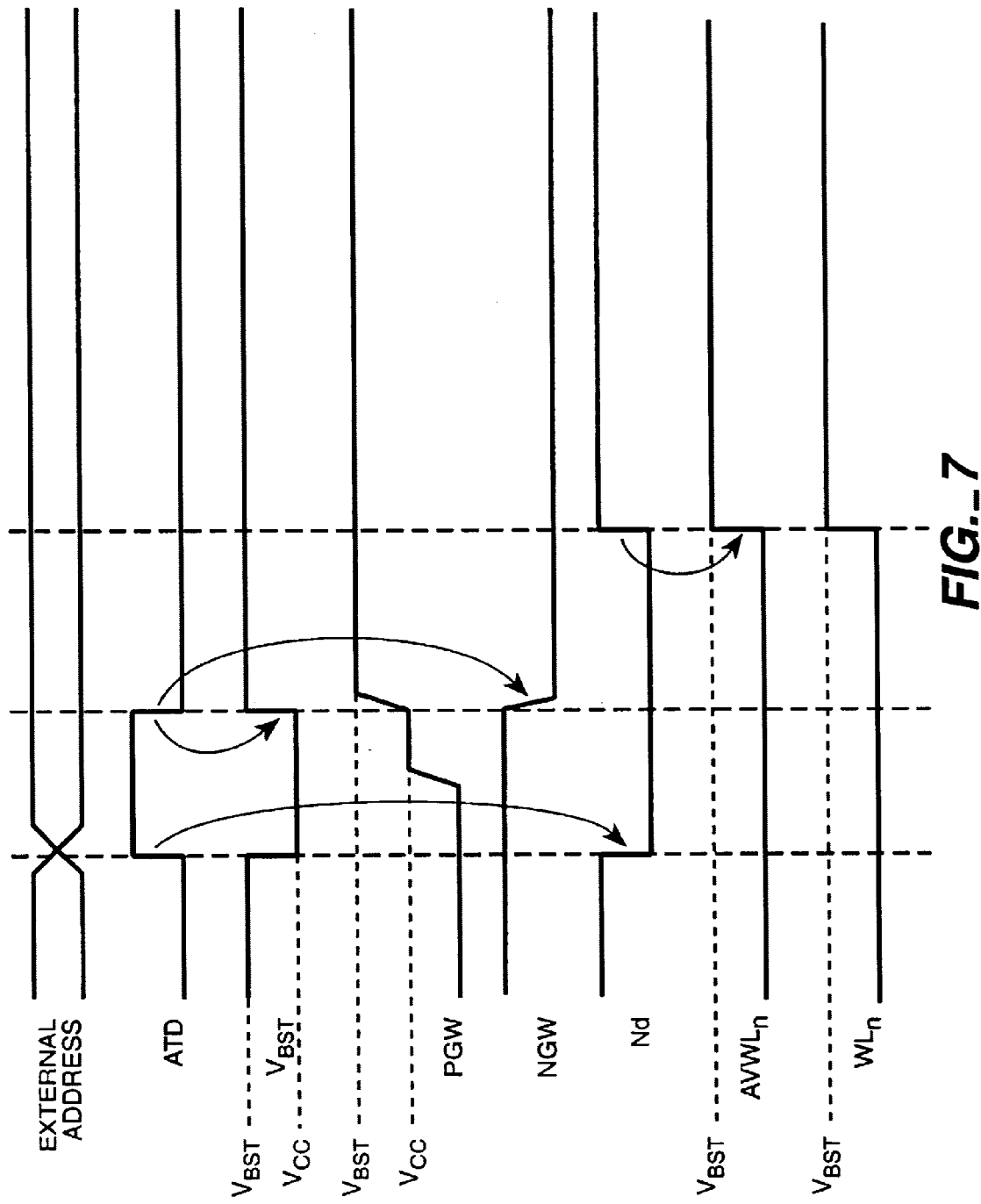
FIG. 7 is a set of time-amplitude diagrams illustrating the waveforms encountered in the operation of the invention.

If one local word line such as $WL_0$ is to be selected, PGW and WLG will be high, and NGW will be low. If $AVWL_0$ goes from low to high under those conditions, $WL_0$ will go up to $AVWL_0$ level. $AVWL_0$, WLG and PGW are best supplied from a boost voltage source $V_{BST}$ such as that illustrated in FIG. 3. The boost voltage generator 30 may consist of an inverter 32 in series at node 38 with a boost capacitor 34 and in parallel with the gate-source circuit of an n-channel transistor 36.

A normally high kickback voltage $V_K$ is applied to the input of inverter 32 so that the $V_{BST}$ output of capacitor 34 is connected to $V_{CC}$ through transistor 36. When a cell is to be read, $V_K$ goes low, node 38 goes high to $V_{CC}$, and with transistor 36 now cut off, $V_{BST}$ goes to $V_{CC}$ plus the voltage stored on capacitor 34. After a read operation, $V_K$ returns to high and readies the circuit for the next read operation.

In the inventive driver circuit, as pointed out above, only one block's PGW will be high to select a local word line such as $WL_0$. Inasmuch as PGW, WLG and AVWL are all supplied from $V_{BST}$, the loading capacitance of the $V_{BST}$ generator of FIG. 3 is minimized so as to allow high-speed word line driving.

Although the above-described circuit solves the $V_{BST}$ loading problem, a special timing scheme is needed for optimum operation of the inventive circuit. Because pull-up transistors 22 and 24 are n-channel transistors, the nodes 28 which are the gates of transistors 22 must be kept high enough to turn them on. In accordance with the invention, a self-boosting scheme is used. For this purpose, AVWL and WL are kept low until the node 28 reaches a high enough voltage during the rise of PGW and WLG to the level of $V_{BST}$. Then, when AVWL is allowed to rise to $V_{BST}$, the voltage at node 28 is automatically boosted above $V_{BST}$ due to the action of the channel capacitance of transistor 22.

Conventionally, a read operation is performed by an internal ATD (address transition detection) pulse generated whenever there is a change in the external address input. Thus, the kickback signal $V_K$ discussed in connection with FIG. 3 above can advantageously be replaced by the ATD pulse, with $V_{BST}=V_{CC}$ while ATD is high immediately after the address change, and $V_{BST}$ being boosted when ATD goes back to low after a short interval.

The ATD pulse is useful for a number of functions in the inventive circuit. FIG. 4 shows a global xdecoder 40 in accordance with the invention. The external address is decoded by a NAND decode gate 42 and is fed to the PGW generator consisting of transistors 44a and 44b. The output of NAND gate 42 also constitutes an input to NOR gate 46, whose other input is the ATD pulse. The output of NOR gate 46 is inverted in inverter 48 to form the NGW signal.

Thus, during the ATD pulse, NGW will be forced high while PGW is selected. During this time, the local word lines WL are forced low by transistor 24 in FIG. 2. At the end of the ATD pulse, one of the NGW lines will be selected and go low, and the $V_{BST}$ generator of FIG. 3 will put out the boosted $V_{BST}$ voltage. This makes the local decoder of FIG. 2 ready to drive the local word line WL.

FIG. 5 illustrates a preferred embodiment of the WLG driver. The WLG signal is common in a vertical block. If that vertical block is selected, the WLG signal should be $V_{BST}$, otherwise it should be $V_{CC}$. This is accomplished as shown in FIG. 5. When the vertical block of FIG. 5 is selected, the NAND gate 50 turns on n-channel transistor 51 and forces the node 52 low. This turns on transistor 54 to pass $V_{BST}$ to WLG while transistor 56 is off. If the block of FIG. 5 is not selected, node 52 is forced high, transistor 54 turns off, transistor 56 turns on, and $V_{CC}$ is applied to WLG. At the same time, transistor 58a turns off, 58b turns on, and 58c turns on, to boost node 52 for improved operation of transistor 56.

Mention has been made above of the need to delay activation of the AVWL signal until the node 28 in FIG. 2 has had time to charge up to $V_{BST}$, so that the channel capacitance of transistor 22 can charge up for an extra boost. FIG. 6a shows a delay circuit 59 for carrying out that task. In that figure, the selector NAND gate 60 has an additional input Nd, which is the ATD pulse stretched out by inverters 62a, 62b, capacitor 64, and NOR gate 66. An alternative version of the delay circuit 59 is shown in FIG. 6b, in which Nd is simply the inverted signal of node 38 in FIG. 3.

Nd goes low when ATD or 38 goes high, and returns to high with a delay time after the end of the ATD pulse. Thus, even though a particular AVWL has been selected, it will stay low (68a on, 68b off, 68c off) until Nd goes high again (68a off, 68b on, 68c on). This allows time for the gate capacitance of transistor 22 to charge up and couple up its gate voltage when AVWL changes from low (0V) to high ($V_{BST}$).

FIG. 7 shows the time relationships, in the operation of the inventive circuit, of the various signals described herein.

What is claimed is:

1. Addressing circuitry for a flash memory laid out in an array of memory blocks and powered by a power supply having a power supply voltage and a ground voltage, each block comprising an array of core cells, and each row of core cells being addressed by a respective local word line, the flash memory having an external address input and an address transition detection signal which pulses in response to a change of value at the external address input, said addressing circuitry comprising:

a source of boost voltage being at the power supply voltage during a pulse of the address transition detection signal and rising to a boost voltage from the power supply voltage following a pulse of the address transition detection signal;

a global xdecoder that receives the power supply voltage, the source of boost voltage, the ground voltage, and the address transition detection signal, and that drives a pair of positive and negative global word lines;

a vertical xdecoder that receives the power supply voltage, the source of boost voltage, the ground voltage, and the address transition detection signal, and that drives a plurality of vertical word lines; and a local word line driver that drives a respective local word line to address a respective row of core cells, the local word line driver having a first n-channel transistor and a second n-channel transistor and receiving a respective vertical word line as an input, the first n-channel transistor having a drain terminal coupled to the respective vertical word line, a gate terminal coupled to the positive global word line, and a source terminal coupled to the respective local word line, the second n-channel transistor having a drain terminal coupled to the respective local word line, a gate terminal coupled to the negative global word line, and a source terminal coupled to the ground voltage;

wherein, when the row of core cells is addressed in response to a pulse of the address transition detection signal, said global xdecoder forces the negative global word line toward the power supply voltage during said pulse so that the respective local word line is pulled toward the ground voltage by the second n-channel transistor, and thereafter in response to the end of said pulse said global xdecoder forces the positive and negative global word lines toward the boost voltage and ground voltage, respectively, causing the voltage on the gate terminal of the first n-channel transistor to be raised and causing the respective local word line to be decoupled from the ground voltage, and wherein said vertical xdecoder is responsive to the end of said pulse of the address transition detection signal and forces the respective vertical word line toward the boost voltage after a delay period from the end of said pulse, thereby raising the voltages of the drain terminal of the first n-channel transistor and the respective local word line and boosting the gate voltage of the first n-channel transistor.

2. The addressing circuitry of claim 1 wherein, when the row of core cells is addressed, said vertical xdecoder further forces the vertical word lines toward the ground voltage during said pulse of the address transition detection signal and said global xdecoder further forces the positive global word line toward the power supply voltage during said pulse, such that said first n-channel transistor also pulls said respective local word line toward the ground voltage.

3. The addressing circuitry of claim 1 wherein the global xdecoder comprises:

a decode gate having a plurality of inputs coupled to respective lines of the external address input, and an output which generates a decoded address signal;

a first driver gate powered from the source of boost voltage and having an input operatively coupled to output of said decode gate and an output which drives the positive global word line; and a second driver gate having an input operatively coupled to the address transition detection signal and the output of the decode gate, and having an output which drives the negative global word line.

4. The addressing circuitry of claim 3, wherein said second driver gate forces said negative global word line to said power supply voltage during said address transition detection pulse.

5. The addressing circuitry of claim 1, wherein said vertical xdecoder comprises:

a delay circuit having an input which receives the address transition detection pulse and an output which generates a stretched address transition detection pulse;

a decode gate having a plurality of inputs and an output, one said input being coupled to the output of the delay circuit and the other said inputs being coupled to respective lines of the external address input, the decode gate generating a decoded row respectively address signal at its output; and a driver gate powered from the source of boost voltage having an input operatively coupled to the output of said decode gate and an output driving the respective vertical word line.

\* \* \* \* \*